United States Patent
Kuo et al.

(10) Patent No.: US 9,010,534 B2
(45) Date of Patent: Apr. 21, 2015

(54) PACKAGING STRUCTURE OF LIQUID CRYSTAL GLASS PANEL

(71) Applicant: Shenzhen China Star Optoelectronics Technology Co., Ltd., Shenzhen, Guangdong Province (CN)

(72) Inventors: Yicheng Kuo, Shenzhen (CN); Shihhsiang Chen, Shenzhen (CN); Gang Yu, Shenzhen (CN); Jiahe Cheng, Shenzhen (CN); Zhilin Zhao, Shenzhen (CN)

(73) Assignee: Shenzhen China Star Optoelectronics Technology Co., Ltd., Shenzhen, Guangdong Province (CN)

( * ) Notice: Subject to any disclaimer, the term of this patent is extended or adjusted under 35 U.S.C. 154(b) by 0 days.

(21) Appl. No.: 13/807,294

(22) PCT Filed: Dec. 4, 2012

(86) PCT No.: PCT/CN2012/085776
§ 371 (c)(1),
(2) Date: Dec. 27, 2012

(87) PCT Pub. No.: WO2014/040346
PCT Pub. Date: Mar. 20, 2014

(65) Prior Publication Data
US 2014/0069835 A1    Mar. 13, 2014

(30) Foreign Application Priority Data
Sep. 11, 2012  (CN) .......................... 2012 1 0334431

(51) Int. Cl.
| B65D 85/48 | (2006.01) |
| B65D 81/02 | (2006.01) |
| H01L 21/673 | (2006.01) |

(52) U.S. Cl.
CPC ........ *B65D 81/022* (2013.01); *H01L 21/67363* (2013.01); *H01L 21/67369* (2013.01)

(58) Field of Classification Search
CPC .......... B65D 81/02; B65D 85/48; B65D 81/05
USPC .......... 206/454, 522, 591, 586, 521; 220/23.4
See application file for complete search history.

(56) References Cited

U.S. PATENT DOCUMENTS

| 4,287,265 | A | * | 9/1981 | McKnight .................. 267/140.3 |
| 4,407,898 | A | * | 10/1983 | Kato et al. .................. 428/542.8 |
| 5,022,527 | A | * | 6/1991 | Braeutigam .................. 206/522 |
| 5,445,274 | A | * | 8/1995 | Pharo ............................. 206/522 |
| 6,722,502 | B1 | * | 4/2004 | Newman ....................... 206/586 |
| 2004/0149618 | A1 | * | 8/2004 | Otaki et al. ................... 206/521 |

FOREIGN PATENT DOCUMENTS

| CN | 2611313 Y | 4/2004 |
| CN | 2799446 Y | 7/2006 |
| CN | 2858546 Y | 1/2007 |
| CN | 101195435 A | 6/2008 |
| CN | 102616488 A | 8/2012 |
| CN | 102795419 A | 11/2012 |
| CN | 102795422 A | 11/2012 |
| GB | 809413 | 2/1959 |
| JP | 2001-19045 A | 1/2001 |
| JP | 2009-269610 A | 11/2009 |

* cited by examiner

*Primary Examiner* — David Fidei
*Assistant Examiner* — Blaine Neway
(74) *Attorney, Agent, or Firm* — Cheng-Ju Chiang

(57) ABSTRACT

The present invention provides a liquid crystal glass panel packaging structure, which includes a package box and a plurality of cushioning bodies arranged inside the package box. The package box includes a lower case and an upper case mating the lower case. The cushioning bodies are airbag cushioning bodies arranged inside the lower case at locations corresponding to corners of a liquid crystal glass panel. The liquid crystal glass panel packaging structure uses airbag cushioning bodies to serve as cushioning devices for a liquid crystal glass panel, whereby with the airbag cushioning bodies being arranged at locations corresponding to corners of the liquid crystal glass panel, better protection is provided to the liquid crystal glass panel to prevent the product from being damaged by external forces. Further, the cushioning bodies of the present invention have a simple structure, is easy to manufacture, and can effectively lower down the manufacturing cost.

5 Claims, 5 Drawing Sheets

PACKAGING STRUCTURE OF LIQUID CRYSTAL GLASS PANEL

BACKGROUND OF THE INVENTION

1. Field of the Invention

The present invention relates to the field of liquid crystal display packaging, and in particular to a liquid crystal glass panel packaging structure.

2. The Related Arts

In the field of manufacture of liquid crystal display devices, the manufacture of liquid crystal display devices includes a process of assembling, which puts various components, including a liquid crystal glass panel, a main control circuit, and an enclosure, together. These components are each manufactured in advance and packaged for being later assembled to form a complete liquid crystal display device. The liquid crystal glass panel, after being manufactured, is packaged in a liquid crystal glass panel package box and then shipped in box to a corresponding assembling station. Commonly used package boxes include cartoons and plastic cases. Plastic cases have better structures and low prices, but show poor cushioning performance so that cushioning blocks must be additionally provided inside the cases to effect cushioning. Commonly used cushioning blocks are made of foaming substance, such as expandable polyethylene (EPE) and ethylene-vinyl acetate (EVA). These substances are of high prices and are hard to restore after being compressed, making cushioning performance deteriorating and incapable of repeated use, so that the recycling value is low and cost control is hard.

As shown in FIG. 1, a conventional liquid crystal glass panel packaging structure comprises an upper case 100 and a lower case 300. The upper case 100 and the lower case 300 mate each other to form an enclosed package box. The lower case 300 forms therein a receiving chamber 302 and a plurality of cushioning blocks 304 provided along an inside perimeter of the receiving chamber 302. To install, liquid crystal glass panels are positioned in the lower case receiving chamber 302 of the package box and leaning against the cushioning blocks 304 mounted inside the lower case. To ship the liquid crystal glass panels, the cushioning blocks 304 are first disposed along the perimeter inside the lower case 302 of the package box and then the liquid crystal glass panels are positioned into the receiving chamber 302. Finally, the upper case 100 is set to close so as to effectively protect and fix the liquid crystal glass panels, preventing the liquid crystal display modules from being damaged by external forces.

However, the cushioning blocks that are included in the liquid crystal glass panel package are of a high cost and are hard to restore the original shape after being compressed so as to lead to insignificant effect of cushioning. Consequently, it sometimes happens that the liquid crystal glass panels get broken during transportation.

Thus, it is a challenge to the present inventor and those devoted themselves to the art to provide a solution for achieving positioning and cushioning effects for liquid crystal glass panels during transportation by including high performance cushioning devices in a liquid crystal glass panel package and also overcoming the problems of the conventional cushioning devices included in a liquid crystal glass panel package being of high cost and showing insignificant effect of cushioning due to being hard to restore the original shape after being compressed.

SUMMARY OF THE INVENTION

An object of the present invention is to provide a liquid crystal glass panel packaging structure, which uses airbag cushioning bodies to serve as cushioning devices arranged in a package box, whereby air layers contained in the airbag cushioning bodies provide and excellent cushioning effect and have a relatively low material cost, making it advantageous for controlling packaging cost.

To achieve the object, the present invention provides a liquid crystal glass panel packaging structure, which comprises a package box and a plurality of cushioning bodies arranged inside the package box. The package box comprises a lower case and an upper case mating the lower case. The cushioning bodies comprise airbag cushioning bodies, which are arranged inside the lower case at locations corresponding to corners of a liquid crystal glass panel.

The cushioning bodies are of an H-shape, which comprises a cushioning section, a mounting section, and a connection section connecting between the cushioning section and the mounting section.

The lower case forms a mounting slot that has an opening to correspond to each of the mounting section. The mounting section IS received and retained in the mounting slot with the connection section extending through the opening and a surface of the cushioning section that opposes the mounting section being positioned against an outside surface of the mounting slot.

The cushioning section, the mounting section, and the connection section are integrally formed.

The cushioning section, the mounting section, and the connection section have interior spaces communicating with each other and filled with a gas.

The cushioning bodies each comprise a first cushioning unit and a second cushioning unit. The cushioning bodies are of an L-shape.

The cushioning bodies are mounted inside the lower case through adhesive bonding. A connection between the first cushioning unit and the second cushioning unit is set at a location corresponding to a corner of the lower case.

The first cushioning unit and the second cushioning unit are both airbags.

The first cushioning unit and the second cushioning unit are integrally formed.

The upper case and the lower case are made of plastic materials.

The present invention also provides a liquid crystal glass panel packaging structure, which comprises a package box and a plurality of cushioning bodies arranged inside the package box, the package box comprising a lower case and an upper case mating the lower case, the cushioning bodies comprising airbag cushioning bodies, which are arranged inside the lower case at locations corresponding to corners of a liquid crystal glass panel;

wherein the cushioning bodies are of an H-shape, which comprises a cushioning section, a mounting section, and a connection section connecting between the cushioning section and the mounting section;

wherein the lower case forms a mounting slot that has an opening to correspond to each of the mounting section, the mounting section being received and retained in the mounting slot with the connection section extending through the opening, a surface of the cushioning section that opposes the mounting section being positioned against an outside surface of the mounting slot;

wherein the cushioning section, the mounting section, and the connection section are integrally formed;

wherein the cushioning section, the mounting section, and the connection section have interior spaces communicating with each other and filled with a gas; and wherein the upper case and the lower case are made of plastic materials.

The efficacy of the present invention is that the present invention provides a liquid crystal glass panel packaging structure, which uses airbag cushioning bodies to serve as cushioning devices for a liquid crystal glass panel, whereby with the airbag cushioning bodies being arranged at locations corresponding to corners of the liquid crystal glass panel, during the transportation of the liquid crystal glass panel, better protection is provided to the liquid crystal glass panel to prevent the product from being damaged by external forces. Further, the cushioning bodies of the present invention have a simple structure, is easy to manufacture, and can thus effectively lower down the manufacturing cost.

For better understanding of the features and technical contents of the present invention, reference will be made to the following detailed description of the present invention and the attached drawings. However, the drawings are provided for the purposes of reference and illustration and are not intended to impose undue limitations to the present invention.

BRIEF DESCRIPTION OF THE DRAWINGS

The technical solution, as well as beneficial advantages, of the present invention will be apparent from the following detailed description of an embodiment of the present invention, with reference to the attached drawings. In the drawings.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 1:
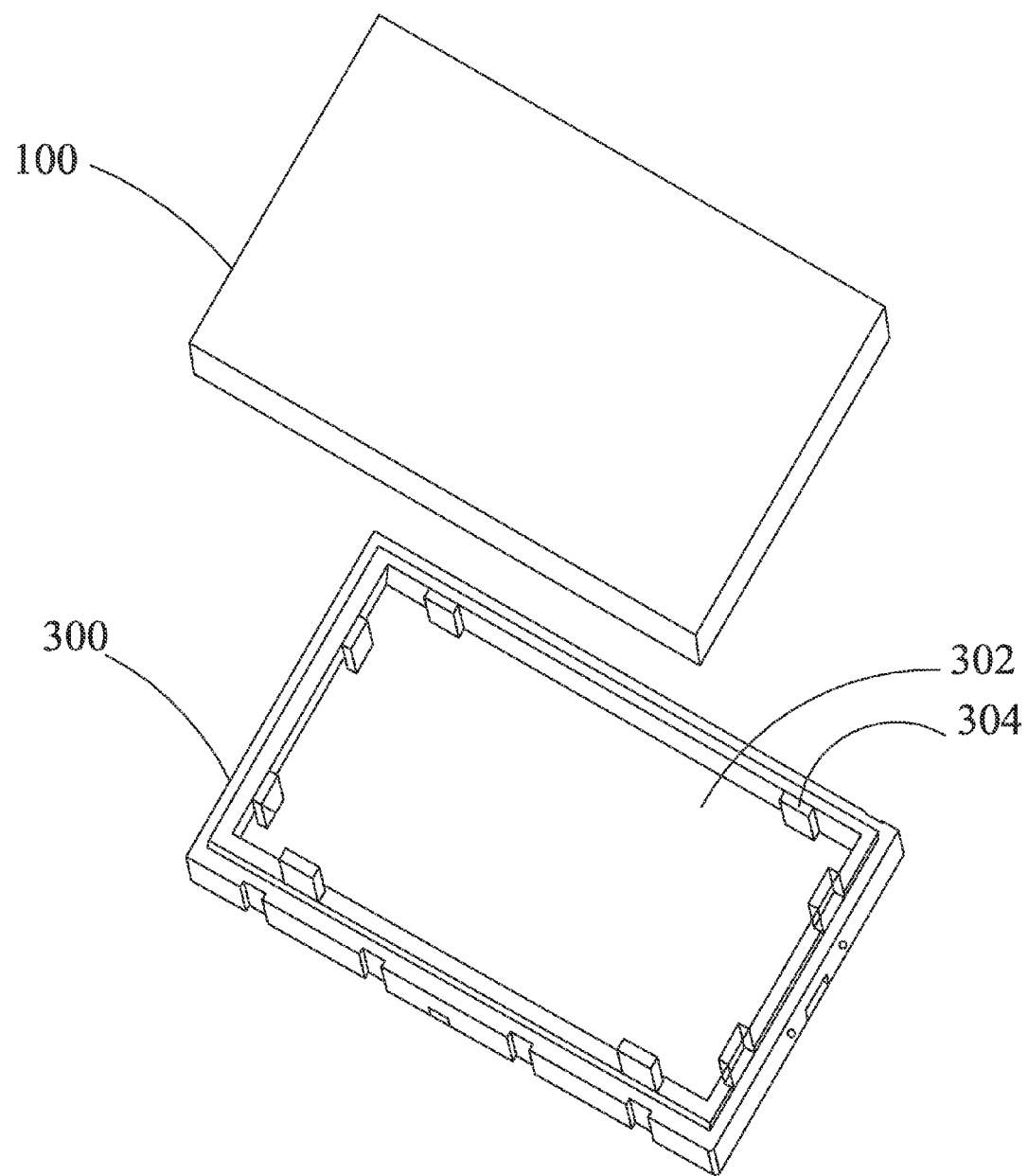
FIG. 1 is a schematic view illustrating a conventional liquid crystal glass panel packaging structure.
Figure 2:
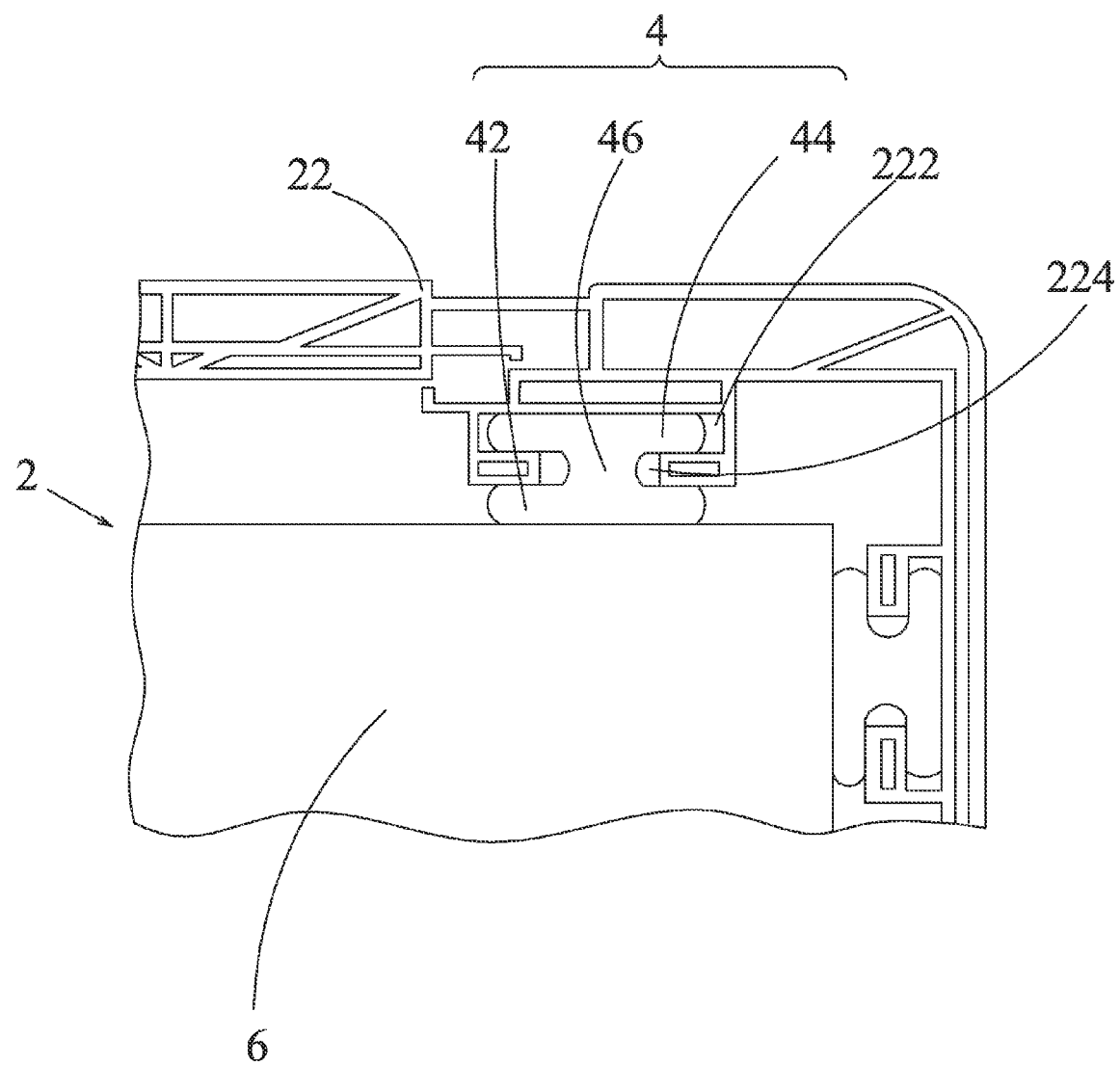
FIG. 2 is a schematic view showing a liquid crystal glass panel packaging structure according to an embodiment of the present invention.
Figure 3:
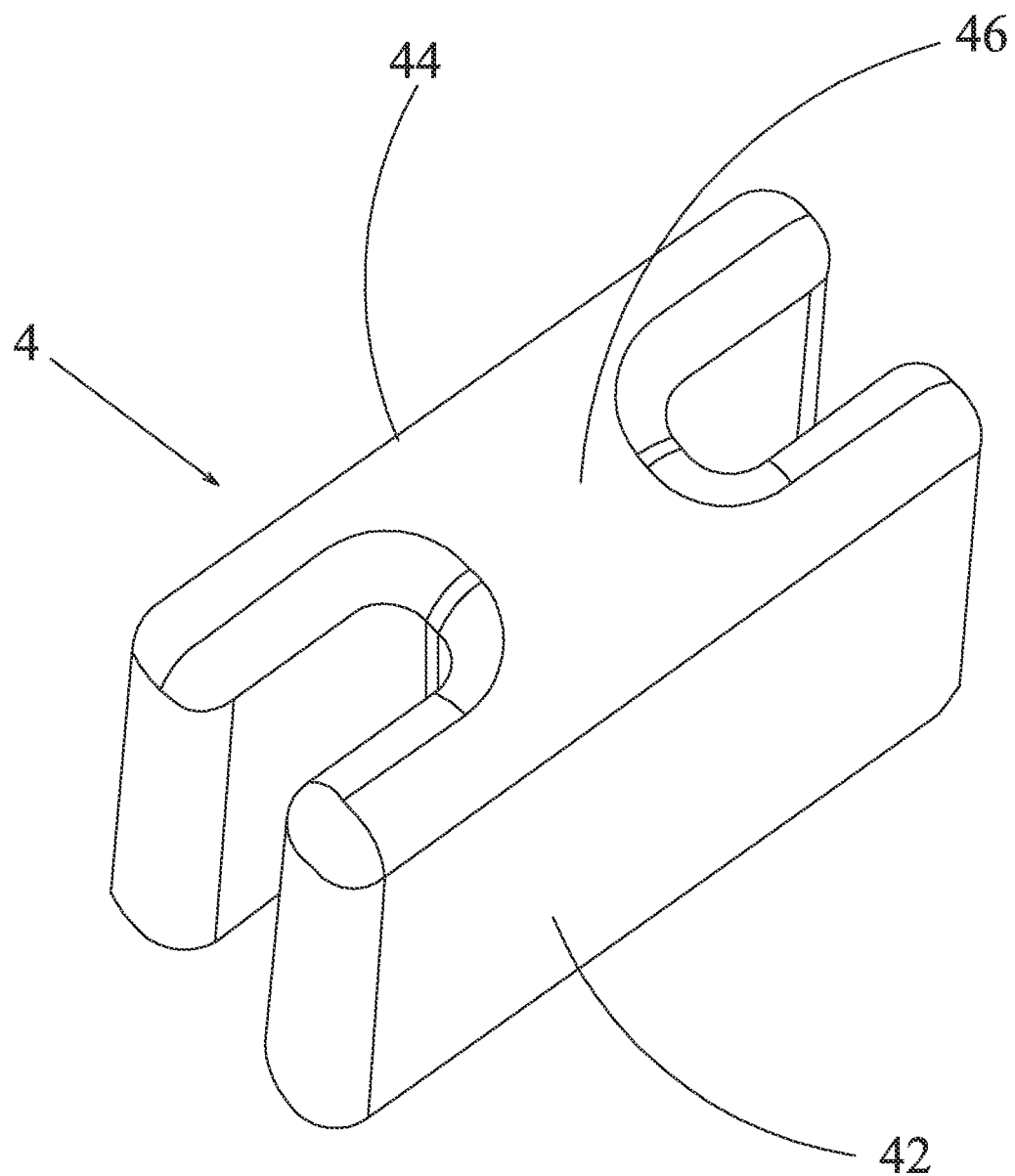
FIG. 3 is a perspective view showing a cushioning body of FIG. 2.

Referring to FIGS. 2 and 3, the present invention provides a liquid crystal glass panel packaging structure, which comprises a package box 2 and a plurality of cushioning bodies 4 arranged inside the package box 2. The package box 2 comprises a lower case 22 and an upper case (not shown) mating the lower case 22. The cushioning bodies 4 comprise airbag cushioning bodies, which are arranged inside the lower case 22 at locations corresponding to corners of a liquid crystal glass panel 6 in order to protect and cushion the liquid crystal glass panel 6 to prevent the liquid crystal glass panel 6 from being damaged by external forces during transportation and warehousing processes.

The upper case and the lower case 22 are both made of plastic materials. Plastic cases are of better structures than commonly used paper cartons and are not easy to break, as well as being humidity resistant and water resistant, so as to provide improved protection. In addition, repeated use of the package box may save packaging cost.

The cushioning bodies 4 are of an H-shape, which comprises a cushioning section 42, a mounting section 44, and a connection section 46 connecting between the cushioning section 42 and the mounting section 44. The cushioning section 42, the mounting section 44, and the connection section 46 are integrally formed and have interior spaces communicating each other and filled with a gas. The gas is usually air. The integrally formed cushioning body 4 has a simple structure and inflation of the whole device can be done by filling air through an air filling opening (not shown) and sealing the air filling opening with a sealing device (not shown) after air filling to thereby achieving an effect of cushioning. To ship the cushioning bodies 4, the gas contained therein is first released to reduce the space occupation rate and thus lowering down transportation cost.

The lower case 22 forms a mounting slot 222 that has an opening 224 to correspond to each of the mounting section 44. The mounting section 44 is received and retained in the mounting slot 222 with the connection section 46 extending through the opening 224, whereby the surface of the cushioning section 42 that opposes the mounting section 44 is positioned against an outside surface of the mounting slot 222. The mounting slot 222 can well retain the H-shaped cushioning body 4 in position, whereby during transportation, since the cushioning effect of the cushioning section 42 is provided by air contained in the cushioning section 42, which undergoes elastic deformation when acted upon by an external force to cushion the external force and quickly restore the original shape when the external force is removed so as to effect better protection of the liquid crystal glass panel 6. Further, arranging the mounting slots 222 inside the package box 2 to fixedly retain the cushioning bodies 4 is of a simple structure and low cost.

Figure 4:
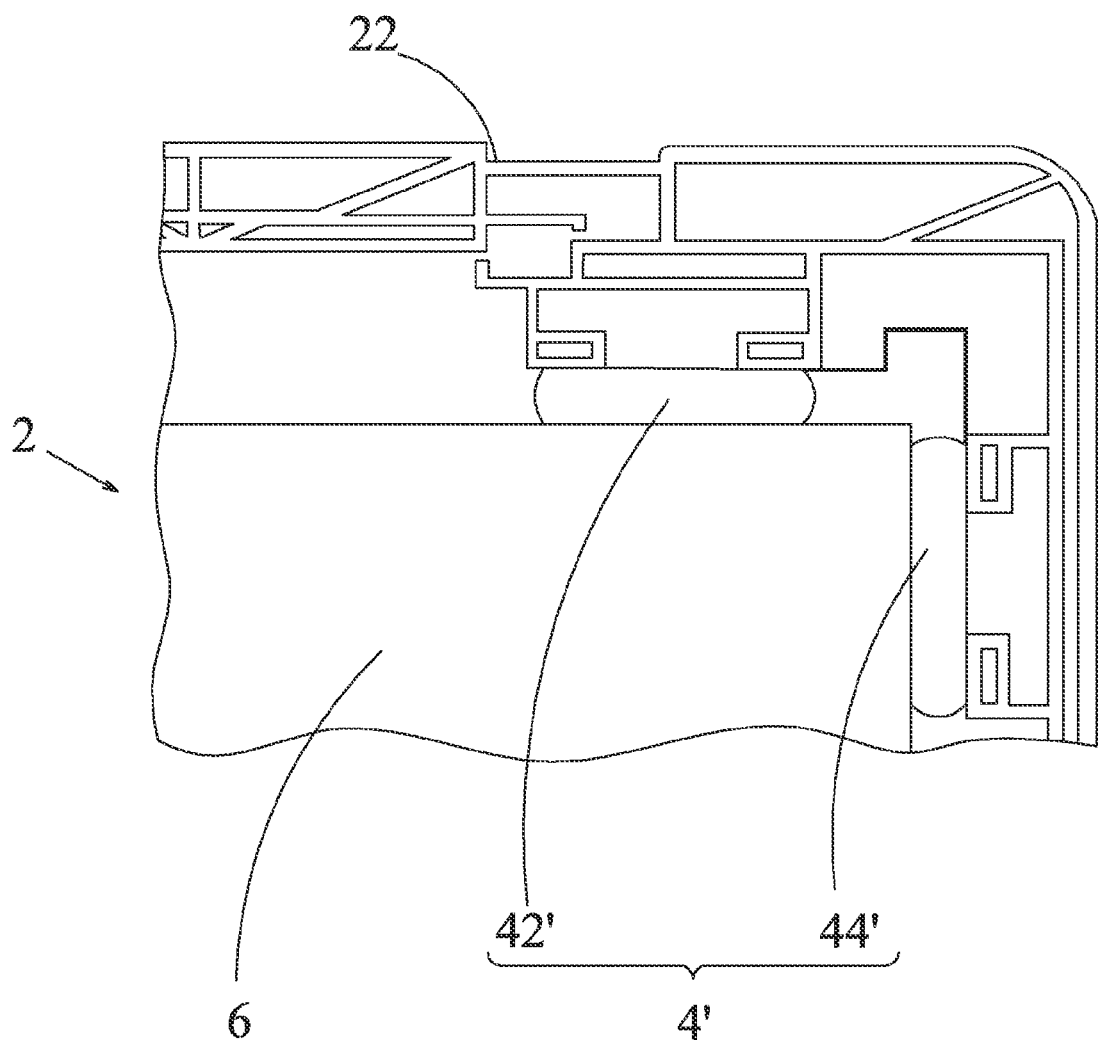
FIG. 4 is a schematic view showing a liquid crystal glass panel packaging structure according to another embodiment of the present invention.
Figure 5:
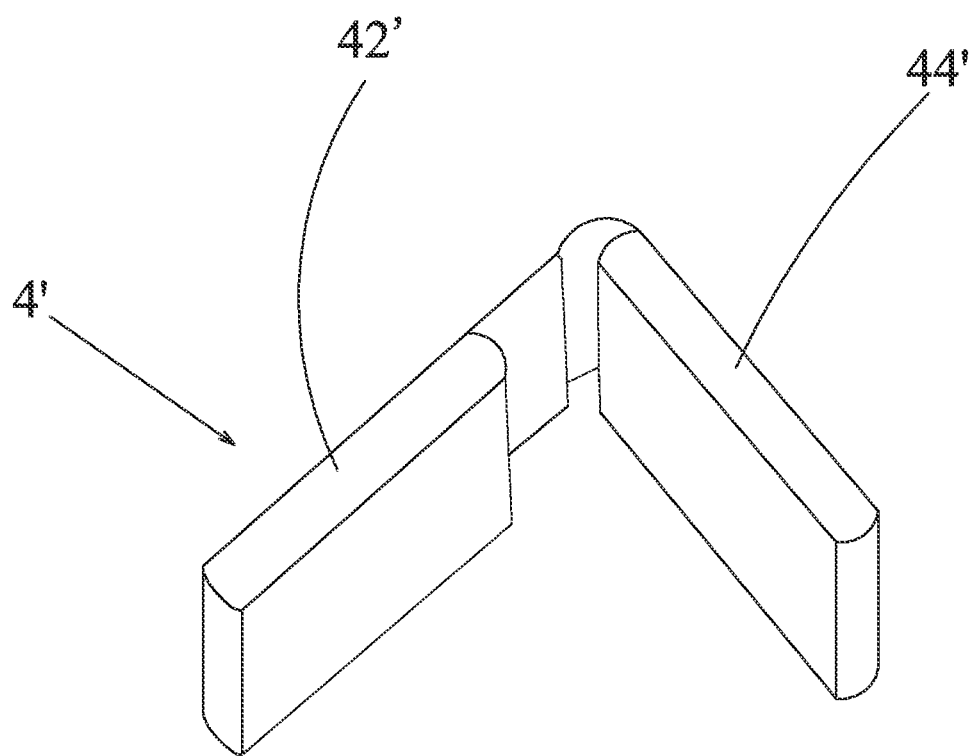
FIG. 5 is a perspective view showing a cushioning body of FIG. 4.

Referring to FIGS. 4 and 5, a schematic view is given to show a liquid crystal glass panel packaging structure according to another embodiment of the present invention, which comprises a package box 2 and a plurality of cushioning bodies 4' arranged inside the package box 2. The package box 2 comprises a lower case 22 and an upper case (not shown) mating the lower case 22. The cushioning bodies 4' comprise airbag cushioning bodies, which are arranged inside the lower case 22 at locations corresponding to corners of a liquid crystal glass panel 6 in order to protect and cushion the liquid crystal glass panel 6 to prevent the liquid crystal glass panel 6 from being damaged by external forces during transportation and warehousing processes.

The upper case and the lower case 22 are both made of plastic materials. Plastic cases are of better structures than commonly used paper cartons and are not easy to break, as well as being humidity resistant and water resistant, so as to provide improved protection. In addition, repeated use of the package box may save packaging cost.

The cushioning bodies 4' is shaped to comprise a first cushioning unit 42' and a second cushioning unit 44'.

The first cushioning unit 42' and the second cushioning unit 44' are both airbags and are both integrally formed with a connection structure 46'. The first cushioning unit 42' and the second cushioning unit 44' are internally filled with air to form air layers. The air layers provide excellent cushioning and protection effect to the corners of the liquid crystal glass panel 6 to prevent, during transportation, sudden acceleration or stopping of a vehicle from causing damages on the liquid crystal glass panel 6 received in the package box 2. Further, the first cushioning unit 42' and the second cushioning unit 44' are integrally formed, making installation and transportation thereof easy.

The cushioning bodies 4' are mounted inside the lower case 2 through adhesive bonding. Preferably, the cushioning bodies 4' are of an L-shape, of which the connection between the first cushioning unit 42' and the second cushioning unit 44' is set at a location corresponding to a corner of the lower case 2. The adhesive bonding can be achieved with a double-sided adhesive tape or a PE plastic bonding agent, a PS plastic bonding agent, or a PVC plastic bonding agent that is specifically used to bond plastic materials. In the instant embodiment, the double-sided adhesive tape is preferably used. Using a double-sided adhesive tape to adhesively bond the first cushioning unit 42' and the second cushioning unit 44' of each of the cushioning bodies 4' to the lower case 2 will fix the cushioning bodies 4' in position. Further, the double-sided adhesive tape can be trimmed to any desired shape and is easy to remove with residual adhesive left being easily removable. Further, the double-sided adhesive tape is cheap in cost and shows an efficacy of environmental protection.

In summary, the present invention provides a liquid crystal glass panel packaging structure, which uses airbag cushioning bodies to serve as cushioning devices for a liquid crystal glass panel, whereby with the airbag cushioning bodies being arranged at locations corresponding to corners of the liquid crystal glass panel, during the transportation of the liquid crystal glass panel, better protection is provided to the liquid crystal glass panel to prevent the product from being damaged by external forces. Further, the cushioning bodies of the present invention have a simple structure, is easy to manufacture, and can thus effectively lower down the manufacturing cost.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A liquid crystal glass panel packaging structure, comprising a package box and a plurality of cushioning bodies arranged inside the package box, the package box comprising a lower case and an upper case mating the lower case, the cushioning bodies comprising airbag cushioning bodies, which are arranged inside the lower case at locations corresponding to corners of a liquid crystal glass panel;
   wherein the cushioning bodies are of an upper-case H-shape, which comprises a cushioning section, a mounting section, and a connection section fixedly connecting between the cushioning section and the mounting section in such a way that the cushioning section and the mounting section have surfaces opposing each other and substantially parallel to each other with the connection section substantially perpendicular to the surfaces of the cushioning section and the mounting section;
   wherein the lower case forms a mounting slot that is delimited between a partition wall and a sidewall of the lower case and the mounting section is received in the mounting slot, the partition wall comprising an opening formed therein to receive the connection section to extend therethrough, whereby the surface of the cushioning section that opposes the mounting section is positionable against an outside surface of the partition wall of the mounting slot and the surface of the mounting section that opposes the cushioning section is positionable against an inside surface of the partition wall of the mounting slot.

2. The liquid crystal glass panel packaging structure as claimed in claim 1, wherein the cushioning section, the mounting section, and the connection section are integrally formed.

3. The liquid crystal glass panel packaging structure as claimed in claim 2, wherein the cushioning section, the mounting section, and the connection section have interior spaces communicating with each other and filled with a gas.

4. The liquid crystal glass panel packaging structure as claimed in claim 1, wherein the upper case and the lower case are made of plastic materials.

5. A liquid crystal glass panel packaging structure, comprising a package box and a plurality of cushioning bodies arranged inside the package box, the package box comprising a lower case and an upper case mating the lower case, the cushioning bodies comprising airbag cushioning bodies, which are arranged inside the lower case at locations corresponding to corners of a liquid crystal glass panel;
   wherein the cushioning bodies are of an upper-case H-shape, which comprises a cushioning section, a mounting section, and a connection section fixedly connecting between the cushioning section and the mounting section in such a way that the cushioning section and the mounting section have surfaces opposing each other and substantially parallel to each other with the connection section substantially perpendicular to the surfaces of the cushioning section and the mounting section;
   wherein the lower case forms a mounting slot that is delimited between a partition wall and a sidewall of the lower case and the mounting section is received in the mounting slot, the partition wall comprising an opening formed therein to receive the connection section to extend therethrough, whereby the surface of the cushioning section that opposes the mounting section is positionable against an outside surface of the partition wall of the mounting slot and the surface of the mounting section that opposes the cushioning section is positionable against an inside surface of the partition wall of the mounting slot;
   wherein the cushioning section, the mounting section, and the connection section are integrally formed;
   wherein the cushioning section, the mounting section, and the connection section have interior spaces communicating with each other and filled with a gas; and
   wherein the upper case and the lower case are made of plastic materials.

* * * * *